United States Patent
Kuth

(10) Patent No.: US 7,069,067 B2
(45) Date of Patent: Jun. 27, 2006

(54) METHOD FOR OPERATING A MAGNETIC RESONANCE APPARATUS AND MAGNETIC RESONANCE APPARATUS FOR IMPLEMENTING THE METHOD

(75) Inventor: Rainer Kuth, Herzogenaurach (DE)

(73) Assignee: Siemens Aktiengesellschaft, Munich (DE)

(*) Notice: Subject to any disclaimer, the term of this patent is extended or adjusted under 35 U.S.C. 154(b) by 442 days.

(21) Appl. No.: 10/142,337

(22) Filed: May 9, 2002

(65) Prior Publication Data
US 2002/0169373 A1    Nov. 14, 2002

(30) Foreign Application Priority Data
May 9, 2001    (DE)    ............................... 101 22 426

(51) Int. Cl.
*A61B 5/05*    (2006.01)
(52) U.S. Cl. ............... 600/410; 600/407; 600/422; 324/316; 324/318
(58) Field of Classification Search ............... 600/410, 600/407, 411, 425
See application file for complete search history.

(56) References Cited

U.S. PATENT DOCUMENTS

| 5,865,743 | A | * | 2/1999 | Godik | ..................... | 600/407 |
| 6,060,883 | A | * | 5/2000 | Knuttel | ..................... | 324/318 |
| 6,123,658 | A |   | 9/2000 | Schweighofer et al. | | |
| 6,179,771 | B1 | * | 1/2001 | Mueller | ..................... | 600/13 |
| 6,198,958 | B1 | * | 3/2001 | Ives et al. | ..................... | 600/411 |
| 6,470,202 | B1 | * | 10/2002 | Rosenfeld | ..................... | 600/410 |

FOREIGN PATENT DOCUMENTS

| DE | 42 25 592 | 2/1994 |
| DE | 199 14 762 | 10/1999 |
| EP | 0 958 844 | 5/1999 |
| WO | WO 99/59674 | 5/1999 |
| WO | WO 99/64884 | 12/1999 |

OTHER PUBLICATIONS

Klose et al, "Funktionelle Bildgebung mit der Magnetresonanztomographie", *electromedica 67*, (1999), pp. 27-36.

* cited by examiner

*Primary Examiner*—Brian L. Casler
*Assistant Examiner*—William C Jung
(74) *Attorney, Agent, or Firm*—Schiff Hardin LLP

(57) ABSTRACT

A method is provided for operating a magnetic resonance apparatus comprising a magnetic stimulation device, the method comprising bearing a region of a central nervous system of a living examination subject in an imaging volume of the magnetic resonance apparatus, whereby this region is to be imaged, operating the magnetic stimulation device for stimulating at least one prescribable location of the examination subject outside of the region to be imaged and generating a functional magnetic resonance image of the region to be imaged for imaging a neuronal activity of the central nervous system, whereby said neuronal activity is initiated by the stimulation.

17 Claims, 1 Drawing Sheet

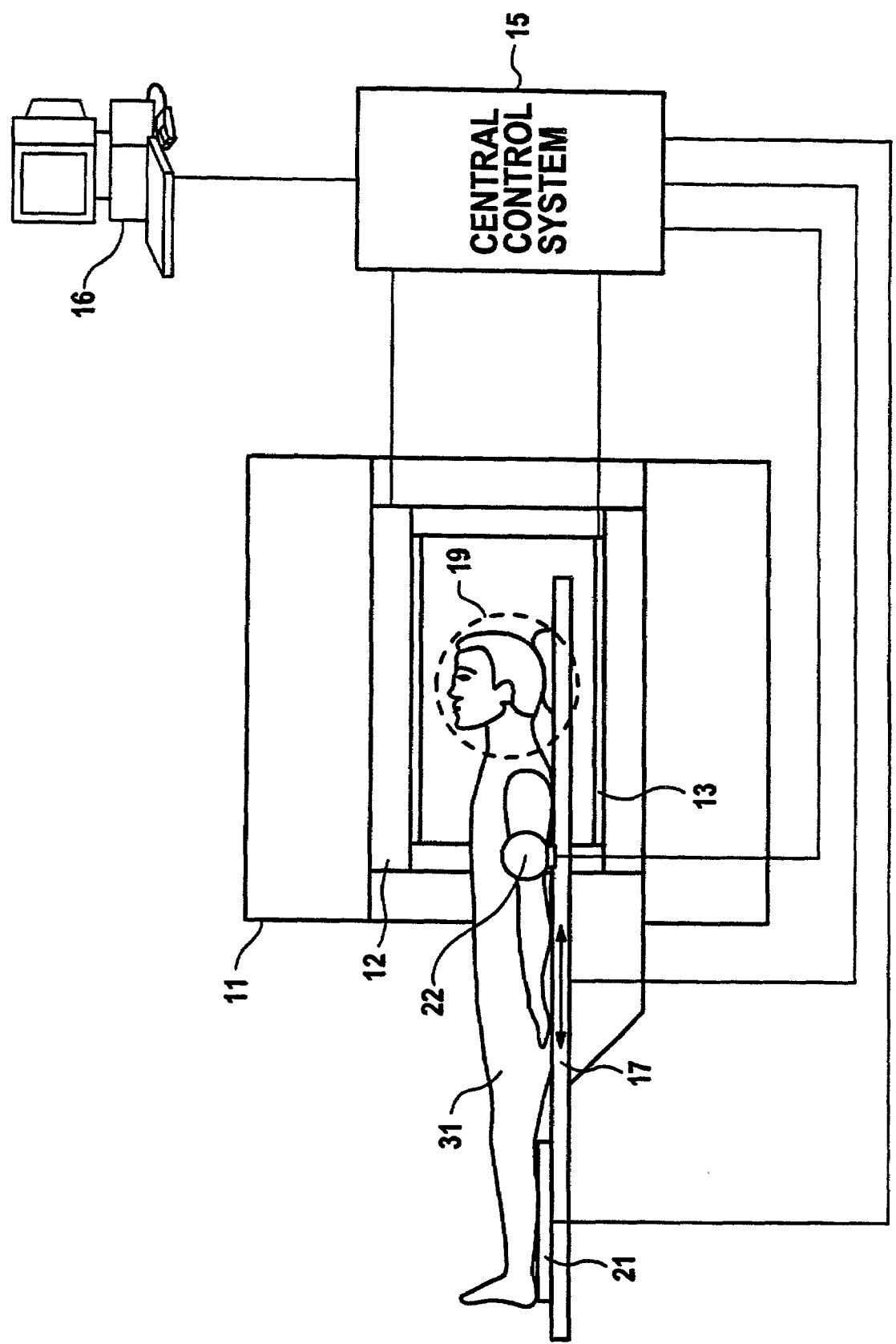

METHOD FOR OPERATING A MAGNETIC RESONANCE APPARATUS AND MAGNETIC RESONANCE APPARATUS FOR IMPLEMENTING THE METHOD

BACKGROUND OF THE INVENTION

1. Field of the Invention

The invention is directed to a method for operating a magnetic resonance apparatus comprising a magnetic stimulation device, and relates to a magnetic resonance device for implementing the method.

2. Description of the Related Art

The magnetic resonance technique is a known technique for generating images of the inside of a body of an examination subject. For this purpose, rapidly switched gradient fields are-superimposed onto a static basic magnetic field in a magnetic resonance apparatus. In order to initiate magnetic resonance signals, high-frequency signals are irradiated into the examination subject and the initiated magnetic resonance signals are accepted by a receiver, by which image datasets and magnetic resonance images are prepared on the basis of these magnetic resonance signals.

In medicine, all methods using repeated scanning of a structure of organs and tissues for imaging chronologically changing processes, such as physiological functions or pathological processes, are referred to as functional imaging. More concretely, with respect to the magnetic resonance technique, these are measuring methods which make it possible to identify and image areals in the nervous system, particularly cerebral areals of a patient stimulated by sensory stimuli and/or by a motor task, sensory task or cognitive task. For example, acoustic or visual stimuli represent sensory stimuli. In the simplest case, a defined movement, such as of the hand or a finger, represent one of the motor tasks.

The functional magnetic resonance imaging is based on the BOLD effect (Blood Oxygen Level Dependent). The BOLD effect is based on different magnetic properties of oxygenated and deoxygenated hemoglobin in the blood. An intensified neuronal activity in the brain is locally associated with an increased supply of oxygenated blood in which the intensity is correspondingly increased at a corresponding location given a magnetic resonance image that is generated by a gradient echo sequence. The BOLD effect, regarding an event initiating the neuronal activity, occurs with a time delay of a few seconds.

In the functional magnetic resonance imaging, three-dimensional image datasets of the brain are acquired (for example, every two to four seconds) based on, for example, an echo planar method. Echo planar methods have the advantage that the acquisition of image datasets are extremely fast—less than 100 ms is required for an individual three-dimensional image dataset. Image datasets with or without a specific neuronal activity are acquired at different points in time. In order to create the functional image, the images that are generated with neuronal activity are differentially compared to the ones without neuronal activity for identifying active cerebral areas. The image datasets acquired with neuronal activity and without neuronal activity are averaged during the comparison, for example, as a result of the comparatively weak BOLD effect of the magnetic resonance technique, so that the functional image contains a secured functional information. The exemplary article of U. Klose et al. "Funktionelle Bildgebung mit der Magnetresonanztomographie", electromedica 67 (1999) book 1, pages 27 to 36 describes the magnetic resonance imaging in greater detail.

German Patent No. 199 14 762 A1 describes a high-frequency head antenna for a magnetic resonance apparatus, in which this high-frequency head antenna forms a structural unit together with a coil arrangement for the transcranial magnetic stimulation. As a result of the structural unit, a high signal-to-noise ratio can be obtained during the acquisition of magnetic resonance signals by the high-frequency head antenna, for example in the framework of a functional magnetic resonance imaging of the brain, and magnetic fields stimulate a selectable location at the surface of the brain. The coil arrangement is fashioned such that it can be separated from its current supply, for example, so that a damaging current induction does not occur in the coil arrangement during an operating state of the magnetic resonance apparatus in which high-frequency signals are transmitted.

European Patent No. 0 958 844 A2 describes a magnetic stimulation device comprising at least one stimulation coil which is connected, with its terminals, to the output of at least one controllable power converter and which has inductivity, current and voltage carrying capacity, so that the stimulation pulses generated by it intersperse at least a volume in the size of extremities, head or torso of a patient with a prescribable magnetic field intensity. The controllable power converter has at least one power semiconductor switch that can be turned on and off and that has short switching times; the power converter, with its input, is switched to a voltage intermediate circuit and the voltage intermediate circuit and the controllable power converter are designed for high output voltages and output currents so that action potentials can also be initiated in neuromuscular tissue of a patient that is situated deeper.

International patent document WO 99/59674 describes a magnetic stimulation device for initiating action potentials, particularly in deeply situated neuromuscular tissue of a patient. For this purpose, the magnetic stimulation device has at least one stimulation coil which is connected, with its terminals, to the output of a current generation unit. Since the current generation unit provides current pulses for the stimulation coil, by which these current pulses are generated in a non-resonant manner, the current pulse shapes can be selected more freely with respect to the magnetic stimulation device. All art references cited above are incorporated herein by reference.

SUMMARY OF THE INVENTION

An object of the invention is to provide an improved method for operating a magnetic resonance apparatus and a magnetic resonance apparatus for implementing the method, with which, among other things, a functional magnetic resonance imaging can also be carried out in a safe and simple way for patients who are not able or willing to cooperate.

This object is achieved by a method for operating a magnetic resonance apparatus comprising a magnetic stimulation device, the method comprising bearing a region to be imaged of a central nervous system of a living examination subject in an imaging volume of the magnetic resonance apparatus, stimulating with the magnetic stimulation device at least one prescribable location of the examination subject outside of the region to be imaged, initiating neuronal activity of the central nervous system by the stimulating, and generating a functional magnetic resonance image of the region to be imaged for imaging the neuronal activity.

This object is also achieved by a magnetic resonance apparatus, comprising a basic field magnetic system configured to generate an optimally homogeneous static basic magnetic field at least within an imaging volume, a gradient system configured to generate optimally linear gradient fields at least within the imaging volume, a high-frequency system configured to initiate and accept magnetic resonance signals of the area to be imaged, a receiving device configured to receive a functional magnetic resonance image produced on the basis of the magnetic resonance signals, and at least one magnetic stimulation device for stimulating a prescribable location.

In more detail, the invention addresses bearing a region of a central nervous system of a living examination subject in an imaging volume of the magnetic resonance apparatus in which this region is to be imaged, operating the magnetic stimulation device for stimulating at least one prescribable location of the examination subject outside of the region to be imaged, and generating a functional magnetic resonance image of the region to be imaged for imaging a neuronal activity of the central nervous system, where this neuronal activity is initiated by the stimulation.

Compared to a magnetic stimulation of the area itself that is to be imaged, the stimulation can be performed in a simple way by magnetically stimulating a location of the examination subject outside of the area to be imaged, which normally is a brain of a patient given the functional magnetic resonance imaging. Therefore, a conventional magnetic resonance apparatus, for example, can be extended by a separate, variably useable magnetic stimulation device in a simple way, without larger adaptations at the magnetic resonance apparatus. The reason for this is that the magnetic stimulation device, particularly its stimulation pulses, can be arranged outside of the imaging volume as a result of the magnetic stimulation outside of the area to be imaged, so that the structure of the imaging volume, comprising a homogeneity of the basic magnetic field and a linearity of gradient fields, remains unaltered.

Furthermore, the forces acting upon the magnetic stimulation device when the magnetic resonance apparatus and the magnetic stimulation device are operated are smaller as if the magnetic stimulation device is arranged within the imaging volume. As a result, the forces can be simply controlled, for example by a large magnetic resonance-compatible mass that is connected to the magnetic stimulation device.

In another embodiment, the present gradient coil system of the conventional magnetic resonance apparatus can also be used for the magnetic stimulation, by which, however, only a region that can be more or less exactly defined at a firmly fixed distance from the imaging volume can be stimulated depending on the design of the gradient coils.

This magnetic stimulation advantageously allows a non-invasive stimulation. In contrast to known methods in which a patient must perform a defined movement (for example, in order to initiate the neuronal activity), the inventive functional magnetic resonance imaging, with the assistance of the magnetic stimulation, does not require the patient to cooperate. Therefore, it is also possible to- examine patients who are not able to cooperate as a result of being unconscious, for example, or who are not willing to cooperate. In view of the previously-cited patients, an at least partial moving incapability can be achieved by anesthesia in order to implement the functional magnetic resonance imaging without risking Injuries.

DESCRIPTION OF THE DRAWING

Further advantages, features, and details of the invention derive from the exemplary embodiment of the invention on the basis of the drawing. The FIGURE is a pictorial block diagram illustrating the inventive method and apparatus.

DETAILED DESCRIPTION OF THE INVENTION

As an exemplary embodiment of the invention, the FIGURE shows a magnetic resonance apparatus which can be inventively operated and which is inventively equipped. The magnetic resonance apparatus has a basic field magnetic system 11 for generating a basic magnetic field and has a gradient coil system 12 for generating gradient fields.

Furthermore, the magnetic resonance apparatus has an antenna system 13 that, for initiating magnetic resonance signals, irradiates high-frequency signals into a patient 31 as an examination subject and that accepts the initiated magnetic resonance signals. The patient 31 can be positioned on a movable bearing device 17.

The magnetic resonance apparatus also has a first magnetic stimulation device 21 and a second magnetic stimulation device 22 that are fashioned as described in European Patent No. 0 958 844 A2 and/or International Patent document WO 99/59674, both herein incorporated by reference. The magnetic stimulation devices 21 and 22 fashioned in the previously mentioned way make it possible to also stimulate deeper situated locations of the patient 3. In one embodiment, only the stimulation coil is arranged in the magnetic stimulation devices 21 and 22; controllable power converters, voltage intermediate circuits etc., which belong to the stimulation coil, are accommodated in the central control system 15 of the magnetic resonance apparatus. In another embodiment, the magnetic stimulation devices 21 and 22 contain at least parts of the previously-cited components in addition to the stimulation coil.

The magnetic stimulation devices 21 and 22 are fashioned such that the magnetic stimulation devices 21 and 22, during the operation of the magnetic resonance apparatus, cannot move against the bearing device 17 as a result of forces acting upon the magnetic stimulation devices 21 and 22. The maximum forces act upon the magnetic stimulation devices 21 and 22 during a current flow in their stimulation coils for generating stimulation pulses. In order to prevent the previously mentioned movement, the first magnetic stimulation device 21 has a large magnetic resonance-compatible mass in that the first magnetic stimulation device 21 has a large casting body made of concrete. Given the second magnetic stimulation device 22, the moving is prevented in that the second magnetic stimulation device 22 can be firmly locked into the bearing device 17.

The first magnetic stimulation device 21 is essentially fashioned in a plate-like manner for placing underneath the patient 31 and contains at least one first and second stimulation coil so that not only a location in the left leg of the patient 31 but also in the right leg of the patient 31 can be simultaneously stimulated or chronologically offset. As a result of the chronologically offset stimulation of a comparable location of the left leg and the right leg, asymmetries between the legs can be determined on the basis of corresponding functional magnetic resonance images. Given a simultaneous magnetic stimulation of the same location in the left leg and right leg, a bringing-together of the neuronal activities initiated by the stimulation can be observed.

The second magnetic stimulation device 22, in a ring-shaped manner, is fashioned such that a location of the arm can be stimulated by correspondingly putting it against the arm.

The gradient coil system 12, the antenna system 13 and the magnetic stimulation devices 21 and 22 are connected to the central control system 15. The central control system 15 is fashioned for controlling currents in the gradient coil system 12 and the magnetic stimulation devices 21 and 22 corresponding to the method process regarding functional magnetic resonance imaging and is fashioned for controlling the method of the bearing device 17. Furthermore, the central control system 15 is fashioned for controlling the released high-frequency signals, for further processing, and for storing the magnetic resonance signals accepted by the antenna system 13. The central control system 15 is also connected to a display and operating device 16 via which inputs of an operator are supplied to the central control system 15 and at which, among other things, the magnetic resonance images are displayed.

In the beginning of a functional magnetic resonance imaging, the patient 31 is positioned on the bearing device 17 which is moved out of the basic field magnetic system 11 as far as possible. The patient 31 is positioned on the bearing device 17 with the head in front, corresponding to the requirements of the functional magnetic resonance imaging in which the central nervous system, particularly the brain of the patient 31, represents the area to be imaged, . Subsequently, the second magnetic stimulation device 22 is correspondingly locked into the bearing device 17 at the location of the arm of the patient 31 to be stimulated and the first magnetic stimulation device 21 is placed on the bearing device 17 such that the desired locations in the legs of the patient 31 can be correspondingly stimulated. The movements of a non-cooperative patient 31, in particular, can be at least partially prevented by administering a corresponding sedative or by a corresponding anesthesia after the patient 31 has been placed on the bearing device 17, for example. The bearing device 17 is subsequently moved such that the head is positioned in the imaging volume 19 of the magnetic resonance device.

Subsequent to the positioning, image datasets must be acquired with a specific neuronal activity and without a specific neuronal activity in order to generate a functional image of the brain of the patient 31; these image datasets, for identifying active cerebral areals, are compared to one another with respect to signal differences. The neuronal activity is initiated by a magnetic stimulation with at least one of the magnetic stimulation devices 21 and/or 22. The stimulation can be varied by varying amplitude, duration and/or rate of increase of the current in the respective stimulation coil of the magnetic stimulation devices 21 and 22. A number of image datasets with and without neuronal activity are acquired and are subsequently subject to a mixing, so that the functional image, with respect to the neuronal activity, contains secure functional information. This is necessary since, with respect to the magnetic resonance technique, the neuronal activity only effects comparatively weak signal differences via the BOLD effect. For example, if the patient 31 has been anaesthetized, a depth of the anesthesia can be monitored based on the functional magnetic resonance images by observing up to which areals of the brain the neuronal activity (which is initiated by stimulations) is forwarded and/or in which areas of the brain the neuronal activity occurs with a particular intensity.

What is claimed is:

1. A method for operating a magnetic resonance apparatus comprising a magnetic stimulation device, the method comprising:
    bearing a region to be imaged of a central nervous system of a living examination subject in an imaging volume defined by the volume of a homogeneous basic magnetic field of the magnetic resonance apparatus;
    stimulating with the magnetic stimulation device at least one prescribable location of the examination subject outside of the imaging volume;
    initiating neuronal activity of the central nervous system by the stimulating; and
    generating a functional magnetic resonance image of the region to be imaged for imaging the neuronal activity.

2. The method according to claim 1, further comprising:
    simultaneously stimulating at least one further location of the examination subject.

3. The method according to claim 1, wherein the prescribable location is a deeply situated location in the examination subject.

4. The method according to claim 1, wherein the prescribable location is situated in an extremity or a torso of a patient.

5. The method according to claim 1, wherein the central nervous system comprises a brain of a patient.

6. The method according to claim 1, further comprising:
    providing an examination subject who has at least a partial moving incapability.

7. The method according to claim 1, further comprising:
    anesthetizing the examination subject; and
    monitoring anesthesia of the examination subject based on the functional magnetic resonance image.

8. The method according to claim 1, further comprising:
    varying a signal controlling the magnetic stimulation device by at least one of amplitude, duration, and rate of increase.

9. A magnetic resonance device for implementing the method according to claim 1, comprising:
    a basic field magnetic system configured to generate an optimally homogeneous static basic magnetic field at least within an imaging volume defined by the volume of a homogeneous basic magnetic field;
    a gradient system configured to generate optimally linear gradient fields at least within the imaging volume and configured as a magnetic stimulation device for stimulating a prescribable location outside the imaging volume; and
    a high-frequency system configured to initiate and accept magnetic resonance signals of the area to be imaged; and
    a receiving device configured to receive a functional magnetic resonance image produced on the basis of the magnetic resonance signals.

10. A magnetic resonance apparatus, comprising:
    a basic field magnetic system configured to generate an optimally homogeneous static basic magnetic field at least within an imaging volume defined by the volume of a homogeneous basic magnetic field;
    a gradient system configured to generate optimally linear gradient fields at least within the imaging volume;
    a high-frequency system configured to initiate and accept magnetic resonance signals of the area to be imaged;
    a receiving device configured to receive a functional magnetic resonance image produced on the basis of the magnetic resonance signals; and at least one magnetic stimulation device for stimulating a prescribable location outside of the imaging volume.

11. The magnetic resonance apparatus according to claim 10, further comprising:
an attachment point configured to unmovably mount the magnetic stimulation device so that it cannot move at least with respect to the point when operating the magnetic resonance apparatus.

12. The magnetic resonance apparatus according to claim 11, further comprising:
a bearing device for bearing the examination subject that comprises the attachment point.

13. The magnetic resonance apparatus according to claim 11, wherein the magnetic stimulation device comprises a large magnetic resonance-compatible mass in order to prevent moving.

14. The magnetic resonance apparatus according to claim 10, wherein the magnetic stimulation device is configured to stimulate a deeply situated location in the examination subject.

15. The magnetic resonance apparatus according to claim 10, wherein the receiving device is a display device.

16. A magnetic resonance apparatus, comprising:
a basic field magnetic system configured to generate an optimally homogeneous static basic magnetic field at least within an imaging volume defined by the volume of a homogeneous basic magnetic field;
a gradient system configured to generate optimally linear gradient fields at least within the imaging volume;
a high-frequency system configured to initiate and accept magnetic resonance signals of the area to be imaged;
a receiving device configured to receive a functional magnetic resonance image produced on the basis of the magnetic resonance signals; and
at least one magnetic stimulation device for stimulating a prescribable location, wherein the magnetic stimulation device is configured to simultaneously stimulate at least two different locations of the examination subject.

17. A magnetic resonance apparatus, comprising:
a basic field magnetic system configured to generate an optimally homogeneous static basic magnetic field at least within an imaging volume defined by the volume of a homogeneous basic magnetic field;
a gradient system configured to generate optimally linear gradient fields at least within the imaging volume;
a high-frequency system configured to initiate and accept magnetic resonance signals of the area to be imaged;
a receiving device configured to receive a functional magnetic resonance image produced on the basis of the magnetic resonance signals; and
at least one magnetic stimulation device for stimulating a prescribable location, wherein the magnetic stimulation device is configured to be fastened outside of the imaging volume.

* * * * *